(12) United States Patent
Kondo et al.

(10) Patent No.: US 6,525,336 B1
(45) Date of Patent: Feb. 25, 2003

(54) SUPERFINE ELECTRONIC DEVICE AND METHOD FOR MAKING SAME

(75) Inventors: Seiichi Kondo, Saitama-ken (JP); Yasuo Wada, Tokyo (JP); Tsuyoshi Uda, Kodaira (JP); Tokuo Kure, Tokyo (JP); Tsuneo Ichiguchi, Saitama-ken (JP); Shinji Okazaki, Urawa (JP); Yoshimasa Murayama, Saitama-ken (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 08/463,761

(22) Filed: Jun. 5, 1995

Related U.S. Application Data

(63) Continuation of application No. 08/043,893, filed on Apr. 7, 1993, now abandoned, which is a continuation-in-part of application No. 07/994,968, filed on Dec. 22, 1992, now Pat. No. 5,561,300.

(30) Foreign Application Priority Data

| Dec. 24, 1991 | (JP) | 3-340649 |
| Dec. 26, 1991 | (JP) | 3-344357 |
| Feb. 6, 1992 | (JP) | 4-020972 |
| Apr. 10, 1992 | (JP) | 4-090612 |
| Aug. 5, 1992 | (JP) | 4-208790 |
| Sep. 22, 1992 | (JP) | 4-252507 |
| Sep. 22, 1992 | (JP) | 4-252511 |

(51) Int. Cl.$^7$ .................................. H01L 29/06
(52) U.S. Cl. ........................................ 257/14
(58) Field of Search ............................ 257/14

(56) References Cited

FOREIGN PATENT DOCUMENTS

EP    A-427443    10/1990

OTHER PUBLICATIONS

*Nature*, vol. 344, No. 6266, Apr. 5, 1990, Eigler et al. "Positioning Single Atoms with a Scanning Tunnelling Microscope", pp. 524–526.
*Elektronik*, vol. 40, No. 21, Oct. 15, 1991, "Einzelnes Atom als elektrischer Schalter".

*Primary Examiner*—Jerome Jackson
(74) *Attorney, Agent, or Firm*—Antonelli, Terry, Stout & Kraus, LLP

(57) ABSTRACT

A superfine electronic device is disclosed, which is constructed by atomic fine lines having a structure in which a plurality of atoms are arranged on one or a plurality of straight lines, in a ring shape or on curves with a size of atomic level, and which includes elements for doping electrons and holes. Using these atomic fine lines, it is possible to integrate semiconductor elements utilizing pn junctions at an atomic level with a high density. A groove having a sufficiently small size is formed in an insulating film disposed on a substrate. Then, atoms or molecules are supplied on the substrate and in the groove, which and are heated to a temperature sufficiently high for moving the atoms or molecules during or after the supply thereof to form a quantum fine line at edge portions of the groove.

40 Claims, 15 Drawing Sheets p TYPE          n TYPE

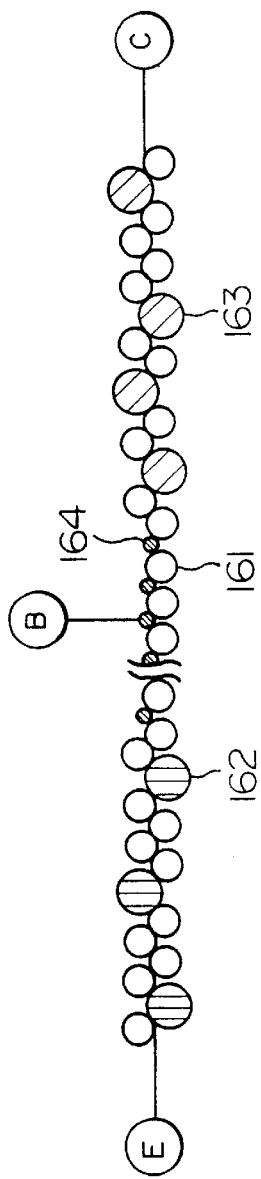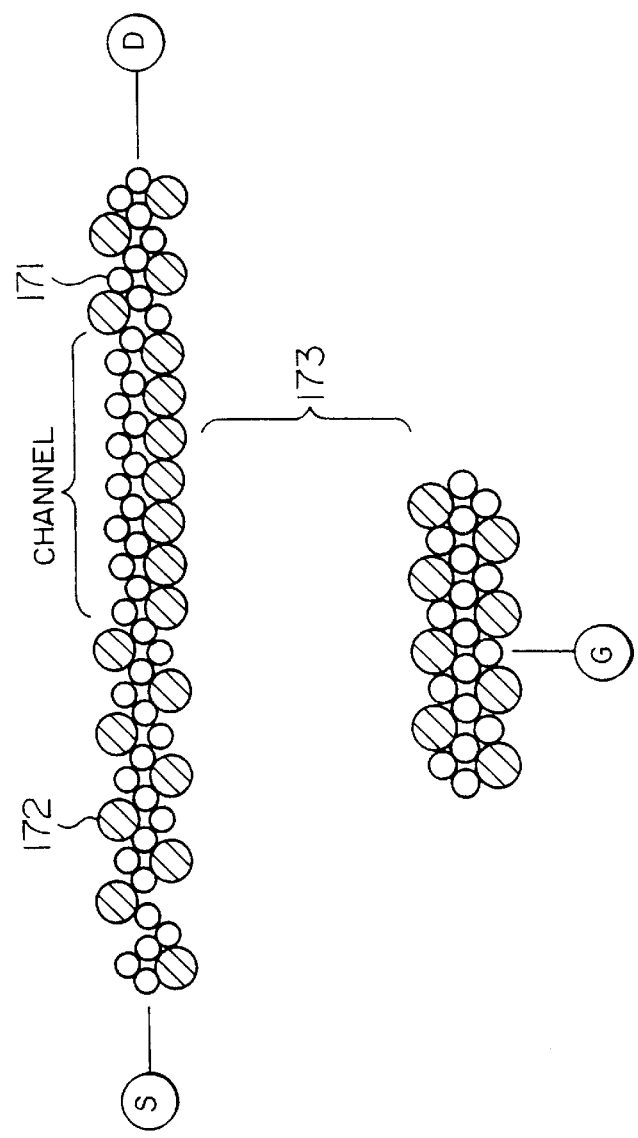

SUPERFINE ELECTRONIC DEVICE AND METHOD FOR MAKING SAME

This is a continuation of application Ser. No. 08/043,893, filed Apr. 7, 1993 abandoned, which is a continuation-in-part of application Ser. No. 07/994,968 filed Dec. 22, 1992 now U.S. Pat. No. 5,561,300.

FIELD OF THE INVENTION

The present invention relates to a superfine electronic device for realizing an ultrahigh density and ultrahigh speed logic and memory circuit, and more in detail, to an atomic fine line or quantum fine line having a size at an atomic level. The invention also relates to a method for making such a device by combining a plurality of atoms arranged on one or a plurality of straight lines, in a ring-shape, on a curve or in a spherical shape in good order or at random, or further by combining atoms in an optimum manner.

BACKGROUND OF THE INVENTION

In a prior art semiconductor electronic device having a structure consisting of switching devices such as transistors, etc. formed in a semiconductor substrate and wiring electrically connecting these devices with each other, outputs of the switching devices are inputted generally to devices in succeeding stages through the wiring.

For this reason, the switching time of the switching devices is influenced often more strongly by time constants determined by resistance and capacitance of the wiring than by characteristics of the devices themselves. That is, in a prior art semiconductor switching device, since the switching time of the whole system was determined by the time constant of the wiring connecting transistors acting as switching elements with each other rather than by the switching time of the transistors, this gave rise to a physical speed limit.

However, this problem has not been studied seriously, because it was possible to improve the property of the system by decreasing the size of the devices according to the so-called scaling rule, by which the size of the devices is decreased isotropically.

However, in prior art electronics, since the scale of the wiring is limited by the minimum dimension scale of semiconductor devices, it is 0.3 μm at the present technical state and even if technical development will be advanced in the future, fine dimensions up to about 0.1 μm at the best will be the limit of the decrease in the scale. On the other hand, since if the thickness of an insulating film is greater than that determined from the point of view of design balance, this can cause defects such as disconnection, etc., there is naturally a limit therein.

In order to overcome this difficulty, as seen e.g. in D. M. Eigler & E. K. Schweizer: Nature 344, 524 (1990), etc., there are have been trials to realize an atomic electronic device by manipulating material at an atomic level by a scanning tunneling microscope (STM).

For these trials, usually an analogy is traced with bulk. In order to construct a superfine line made of a metal conductor by manipulating material at an atomic level, it is usual to try to arrange single metal atoms such as Al, Ag and Au one-dimensionally with a width of at most several atoms by using peripheral techniques of STM.

Further, similarly to the case for electronics in bulk, it was usual to try to construct a diode or a transistor while controlling the conductivity type of a semiconductor so that it was of p type or n type by introducing an extremely small quantity of impurity of about 1 ppm into it.

SUMMARY OF THE INVENTION

When it was attempted to construct semiconductor elements such as diodes, transistors, etc. in the form of an integrated circuit, a limit occurred in its integration density. This was due to the fact that a method was adopted for forming a pn junction, by which impurities were diffused or impurity ions were implanted.

That is, if the size of elements is decreased and the integration density is raised, this gives rise to a problem of the statistical fluctuation limit due to the fact that the number of impurity atoms per unit volume decreases or a problem of size limit produced by the width of a space charge layer.

For this reason, the limit of decrease in the size of semiconductor elements according to prior art techniques is 0.1 μm at minimum and further decrease in the size of elements or increase in the integration density is substantially impossible.

One of the objects of the present invention is to provide integrated elements with an ultrahigh density exceeding such a limit of the integration density.

The above object can be achieved by constructing pn junction elements using atomic fine lines with a size of atomic level. The atomic fine lines have a structure in which a plurality of atoms are arranged on one or a plurality of straight lines, in a ring shape, in a cubic shape, or on curves. A pn junction using atomic fine lines consists of atomic fine lines and respective elements supplying electrons and holes thereto. The respective elements supplying electrons and holes are constructed by doping atoms having a property of supplying electrons and doping atoms having a property of attracting electrons, respectively. The doping concentration of electrons or holes is regulated by varying the distance between the atomic fine lines and the doping atoms or the density of the doping atoms.

Such a junction between an electron conduction region and a hole conduction region at an atomic level will be explained, and will be referred to herein as an atomic fine line pn junction.

Further, the present invention proposes to obtain stable atomic fine lines having a high conductivity and atomic fine lines whose conductivity type is controlled so as to be of p type or n type by combining specified atomic species.

The present invention is characterized in that, in order to achieve a device at an atomic level, no analogy is traced with bulk, but it is found and utilized that combinations of atomic species, which are thought to be rather unusable in a bulk for their stability, can act usefully.

Therefore, in the decrease in the size of the present device structure and the increase in the speed thereof, there is a physical and technical limit, and in order to realize further high speed switching, a completely new device structure and superfine wiring structure is required.

BRIEF DESCRIPTION OF THE DRAWINGS

FIG. 22 is a diagram showing the structure of a transistor having a one-dimensional conductor whose conductivity type is controlled so as to be of p type and n type described in Embodiment 3;

FIG. 23 is a diagram showing the structure of a field effect transistor having two one-dimensional conductors of only one conductivity type described in Embodiment 4;

DESCRIPTION OF THE PREFERRED EMBODIMENTS

Figure 1:
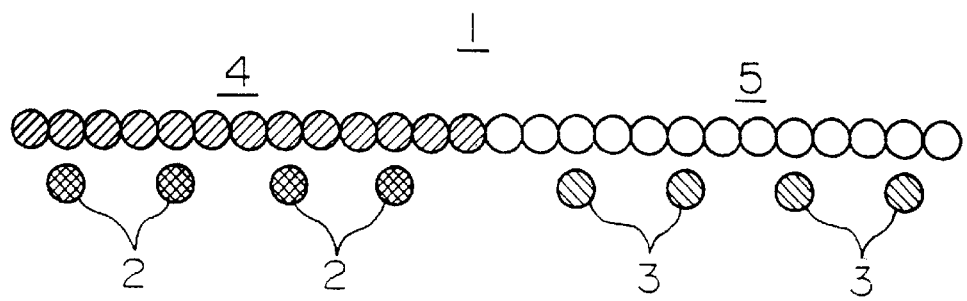
FIG. 1 is a diagram showing the principle of an atomic fine line pn junction element.

Hereinbelow the present invention will be explained in detail, using several preferred embodiments.

The principle of a pn junction disclosed in the present invention will be explained, using FIG. 1. It is composed of an atomic fine line 1 having a size of atomic level, in which a plurality of atoms are arranged on one or a plurality of straight lines, in a ring shape. A in a three dimension shape, or on a curve, an n conductivity type region 5 having a higher electron density due to doping atoms 3 (indicated by downward hatching towards the right) will supply electrons, and a p conductivity type region 4 having a higher hole density due to doping atoms 2 (indicated by cross hatching) will supply holes. Doping atoms consist of atoms having a high power of supplying electrons (donor) and atoms having a high power of attracting electrons (acceptor). Electrons are supplied from the former to the atomic fine line, while holes are supplied from the latter thereto.

The supply amount of electrons or holes can be adjusted by varying the density of the doping atoms and the distance therefrom to the atomic fine line. In general, the supply amount of electrons or holes to the atomic fine line can be made uniform by choosing a distance between doping atoms so as to be smaller than the distance from the doping atoms to the atomic fine line. On the contrary, in order to have a periodical variation in the dopant concentration, the distance between doping atoms may be made greater than the latter.

Formation of the atomic fine line can be effected by using a scanning type probe microscope represented by a scanning type tunnel microscope. It is possible to attract an atom on the uppermost surface of solid towards a probe or put it on the surface by choosing the potential applied to the probe. The potential applied to the probe differs, depending on the element to be dealt with. By this method, it is possible to construct a transistor and thus to form a semiconductor circuit integrated with an ultrahigh density.

(Embodiment 1)

In the present embodiment a method for realizing an atomic fine line and a construction of a pn junction will be explained more concretely. For realizing the atomic fine line, a scanning type tunnel microscope operable in an ultrahigh vacuum was used. It is well known that the scanning type tunnel microscope is composed of a scanning mechanism using a piezo element, a probe, an electronic control circuit, a vibration damping mechanism, etc., and that in this way it is possible to observe an atomic image on a surface of a solid. By suitably the potential applied to the probe, it is possible to attract atoms on the uppermost surface of solid towards the probe or on the contrary to put them on the surface. Consequently, it is possible to arrange desired atoms on the surface of solid one after another by using the probe to realize an atomic fine line. There are atoms which are known to move freely on the surface of a solid, such as Xe atoms, depending on the species of elements. However, by fixing them by cooling the sample to a cryogenic temperature it is possible to arrange them at a desired position.

As an example, a method for forming a fine line of silicon (Si) atoms on a surface of a silicon dioxide ($SiO_2$) layer will be explained. Atoms necessary for forming the atomic fine line can be supplied arbitrarily to the surface of solid by an evaporation method, sputtering a method, a method by which gas is supplied as it is, etc. In order to form it with a plurality of species of atoms, desired species of atoms can be deposited on the surface. The position of these atoms can be easily verified by observing the surface of the sample by means of the scanning type tunnel microscope.

The formation of the atomic fine line of Si atoms can be effected according to the following steps. The probe is moved towards the position of an Si atom existing on the surface so that the distance between the probe and the Si atom is about 0.3 nm, and a pulse having a duration of about 70 msec and an amplitude of about 5 V is inputted to the probe. In this way, the Si atom moves towards the probe from the $SiO_2$ surface.

Next the probe is moved to the position where the atomic fine line was to be formed and then a pulse having a potential of reverse polarity is applied thereto to return the Si atom to the $SiO_2$ surface. By repeating this process it is possible to form the Si fine line constructed by Si atoms.

Further, for Si, since atoms on the surface move relatively easily at a high temperature state of several hundreds of ° C., it is efficient also to heat the sample. However, for atoms, which can move satisfactorily easily even at the room temperature, it is more efficient to cool the sample. It is not always necessary to restrict the method for moving atoms to that described above, but it is possible also to move atoms existing on the surface of solid while rolling or sliding them.

Figure 10:
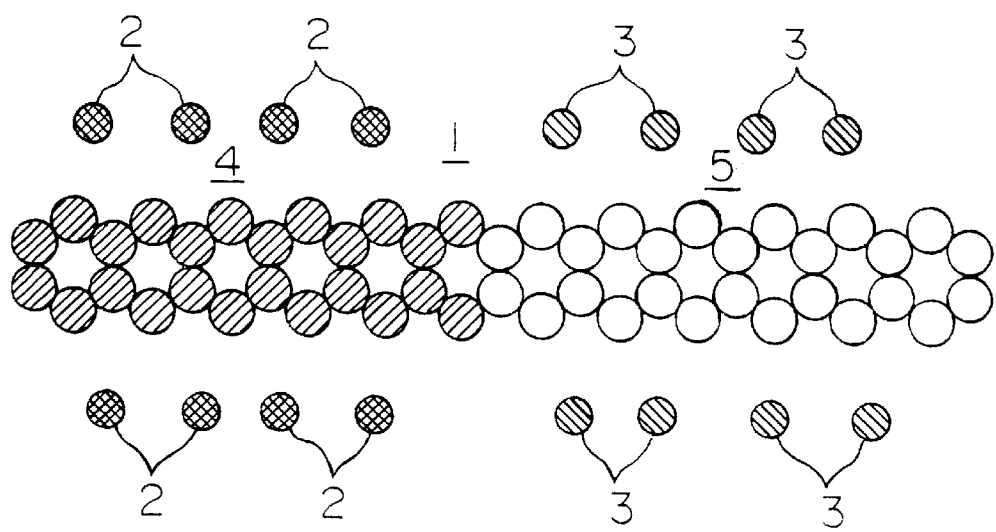
FIG. 10 is a diagram indicating the structure of an example of atomic fine lines having a structure, in which a unit structure consisting of a plurality of atoms bound in a ring shape is repeated, adjacent two rings having a part of the atoms in common.

It is not always necessary that the structure of the atomic fine line is a straight line. For example, for an element having a binding state of strong directivity, a meandering zigzag structure can be more stable. There are also cases where structures, in which a unit structure consisting of atoms bound in a ring shape is repeated or a unit structure consisting of atoms bound in a ring shape is repeated with a part of atoms common to adjacent two rings or a plurality of units having different structures are connected one after another, are useful. Further, it is possible to arrange atoms three-diemensionally such as in a spherical shape. Even if the atomic fine line is a straight line, it is not always necessary that atoms are arranged with a constant interval. FIG. 10 shows an example of the atomic fine line 1 having a structure, in which a unit structure consisting of a plurality of atoms bound in a ring shape is repeated with a part of atoms common to adjacent two rings. In this case, although doping atoms 2 and doping atoms 3 are arranged on both the sides of the atomic fine line so as to obtain good symmetricity, there is no substantial hindrance, even if they are arranged only on one side in the same way as indicated in FIG. 1.

The band gap can be controlled by having the atomic fine line have a periodicity such as ababab . . . or aabbaabb . . . (a≠b) instead of usual aaaa . . . , a being a constant interval between atoms. For example, in the case where sodium atoms are used, the band gap is 0.07 eV for a/b=1.01 and 0.30 eV for a/b=1.10. That is, the control of the band gap can be achieved not only by choosing the species of atoms constituting the atomic fine line but also by choosing the interval between atoms to be a suitable value.

Next, a method for doping the atomic fine line with holes and electrons for forming a pn junction will be described. It was possible to form it by dividing the Si atomic fine line into two regions and by arranging, e.g., sodium (Na) atoms and chlorine (Cl) atoms beside them as donor atoms and acceptor atoms, respectively.

The method for arranging the respective atoms is realized by means of the scanning tunneling microscope (STM) similarly to the method for dealing with Si atoms. Since the Na atoms have a high power of supplying electrons and the Cl atoms have a high power of attracting electrons, an effect of supplying electrons and holes to the Si atomic fine line can be obtained by arranging these atoms.

FIG. 1 indicates the structure of a pn junction using an atomic fine line formed by this method. A current of about 0.1 nA will be able to flow through this pn junction in the atomic fine line formed by this method under a voltage of 0.5 V. Further, it can be verified also that a greater current can flow therethrough by irradiating the junction with microwaves having a wavelength of several tens of cm.

Figure 2:
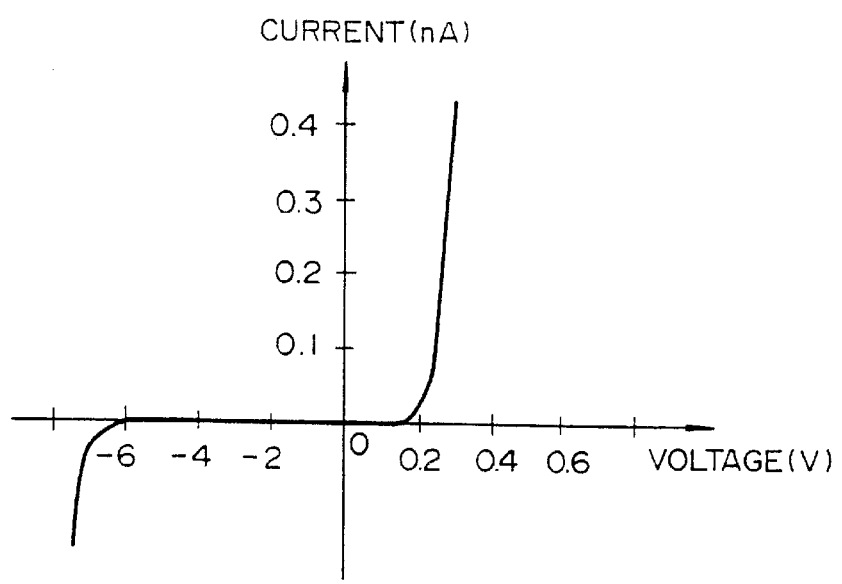
FIG. 2 is a graph indicating voltage vs. current characteristics of the atomic fine line pn junction element.

In addition, if current vs. voltage characteristics are measured, a rectifying property, by which the intensity of the current flowing therethrough differs significantly, depending on the polarity of the applied voltage, as indicated in FIG. 2, will be obtained.

The doping concentration with electrons and holes can be regulated by utilizing the density in number of donor atoms and acceptor atoms or by varying the distance therefrom to the Si atomic fine line. Generally a more uniform doping concentration can be obtained, when the distance between the atomic fine line and the doping atoms is greater than the distance between doping atoms. Although in the present embodiment Na atoms and Cl atoms are preferably used as doping atoms, atoms having a high power of supplying electrons such as group IA elements as potassium (K), caesium (Cs), lithium (Li), etc.; group IIA elements as calcium (Ca), etc, and group IIIA elements as yttrium (Y), etc. and atoms having a high power of attracting electrons such as group VIIB elements as fluorine (F), etc., and group VIB elements as sulphur (S), etc. can be used instead thereof, respectively.

Further, although, in the present embodiment, the atomic fine line is constructed with a distance of 0.5 nm between donor atoms and between acceptor atoms and a distance of 0.5 nm therefrom to the atomic fine line, in this case the electron density corresponding to about 1% of elementary charge per atom, the distances between respective atoms can be determined by electron density necessary for the device operation.

In the case where the width of the atomic fine line is greater than that corresponding to several atoms, a similar doping effect can be obtained also by putting doping atoms within the atomic fine line. Boron (B), phosphorus (P), etc. used for forming a prior art pn junction can be used also as doping atoms at this time.

Figure 3:
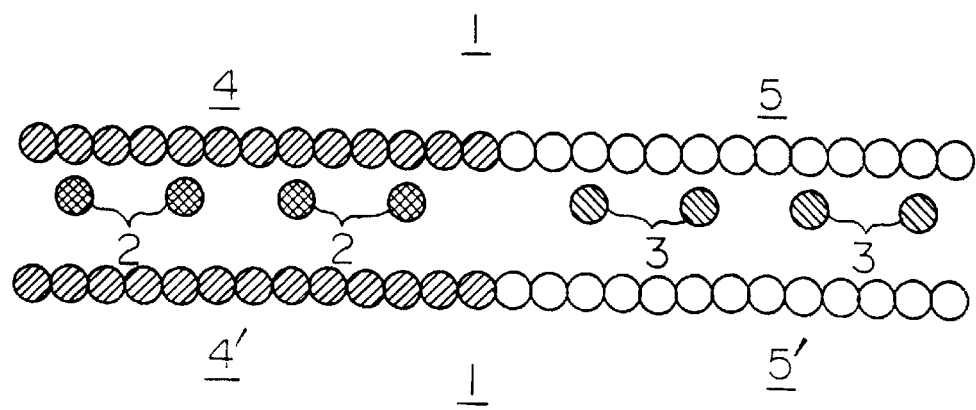
FIG. 3 is a diagram showing the principle of an atomic fine line pn junction element having different doping concentrations.

FIG. 3 shows an example, in which a high concentration doped region 4, 5 and a low concentration doped region 4', 5' are realized simultaneously in two atomic fine lines 1 and 1' by varying the distance between the doping atoms and the Si atomic fine lines. One of the Si atomic fine lines, which is closer-to the doping atoms, is doped with a high concentration and the other is doped with a low concentration.

It is possible also to construct a plurality of atomic fine line pn junctions by increasing the number of atomic fine lines and doping atoms and by arranging them in parallel.

Figure 4:
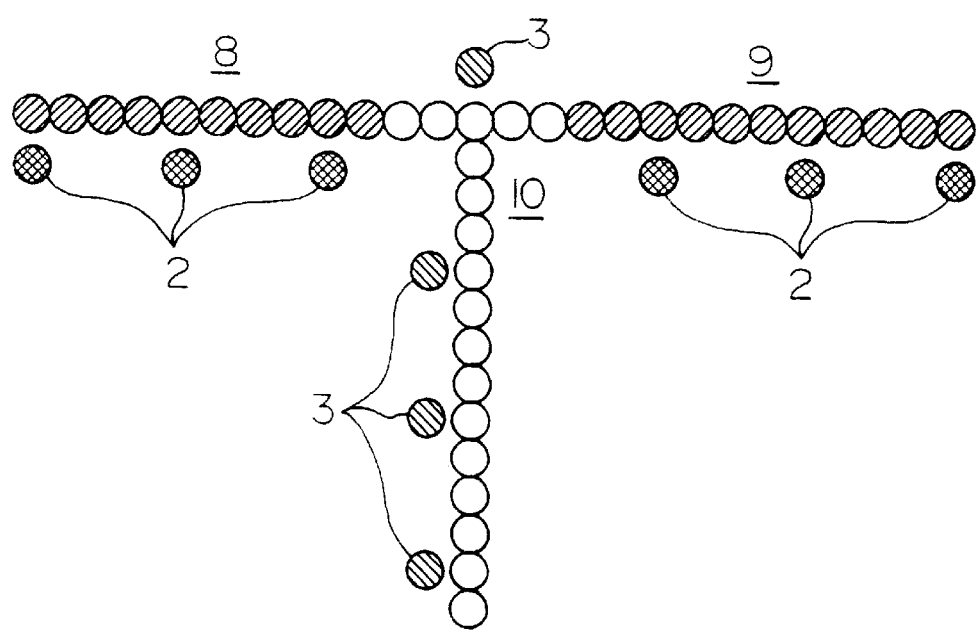
FIG. 4 is a diagram showing the principle of an atomic fine line transistor.

FIG. 4 shows an example, in which a transistor is realized by utilizing atomic fine lines described above. It is composed of three regions, i.e. an emitter 8 (a p conductivity type region having a high hole density), a collector 9 (a p conductivity type region having a high hole density) and a base 10 (an n conductivity type region having a high electron density). Using this type of transistor, it was possible to obtain a very high integration density with respect to a prior art semiconductor integration circuit. Although a pnp type transistor is disclosed in the present embodiment, it is possible also to form an npn type transistor by interchanging the n type and the p type.

Although the substrate, on which the atomic fine lines are formed, is not specifically restricted, it is desirable that it is made of an insulator. For example, it was found also that a surface, in which one layer of Xe atoms is adsorbed at a cryogenic temperature (about 4 K), is useful. Further, since at room temperature, an $MOS_2$ substrate is in a state where only sulphur atoms exist on the surface and thus there is no serious problem of adsorption, it was very easy to form atomic fine lines thereon.

The species of atoms for forming the atomic fine lines is not restricted to Si, but Ge and C are also useful. It was found further that results similar to those obtained by the present embodiment can be obtained by using atomic fine lines made of metal atoms such as Au, W, Mo, etc. and thus a pn junction can be formed.

(Embodiment 2)

In the present embodiment light emitting phenomena by an atomic fine line pn junction are disclosed.

Figure 5:
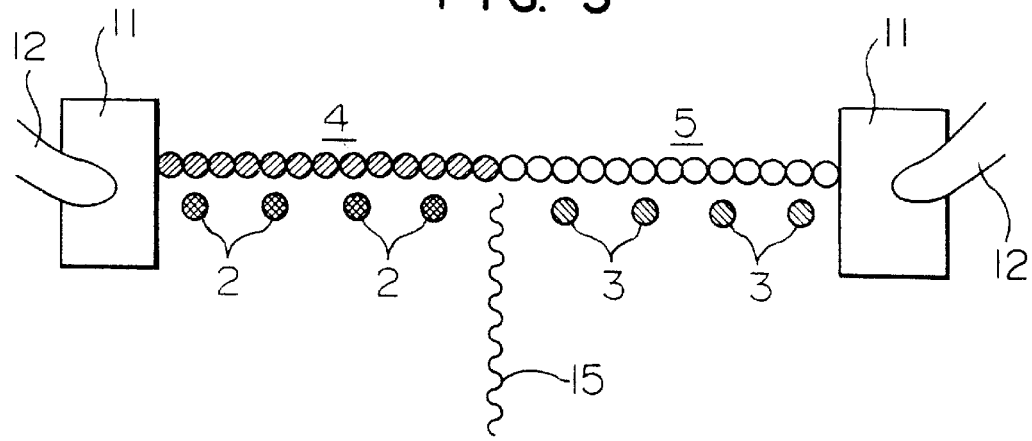
FIG. 5 is a diagram indicating the structure of a light emitting diode using an atomic fine line pn junction element.

FIG. 5 shows the structure of an atomic fine line light emitting diode consisting of an atomic fine line forming an n type region 5 and a p type region 4, bonding pads 11, donor atoms 3 and acceptor atoms 2. The real bonding pads 11 and lead wires 12 can be fabricated by using photolithography techniques and bonding techniques utilized for ultra large scale integrated circuits (ULSI) and large with respect to the atomic fine line. Light 15 having a wavelength corresponding to the band gap of the atomic fine line is emitted by the pn junction portion in the atomic fine line by injecting current into the bonding pads 11 made of gold, copper, aluminum or other suitable materials through the lead wires 12, which are also made of gold, copper, aluminum or other suitable materials. The light emitting efficiency of an atomic fine line light emitting diode is 1 in principle, and a light emitting efficiency about two orders of magnitude times as high as that obtained by prior art light emitting diode is obtained. The wavelength of emitted light can be arbitrarily regulated by regulating the band gap in the atomic fine line.

Figure 6:
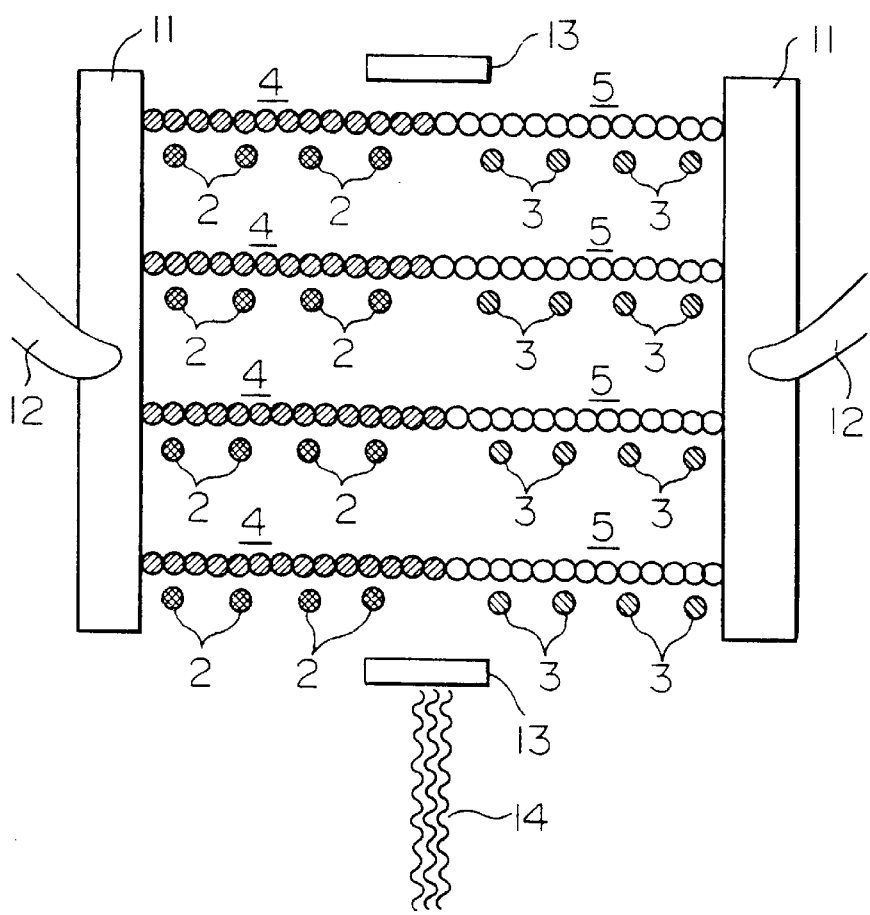
FIG. 6 is a diagram indicating the structure of a laser using an atomic fine line pn junction element.

Utilizing light emitting phenomena from the pn junction in the atomic fine line, it is possible to fabricate a laser. A method used therefor will be disclosed. At first, atomic fine lines fabricated in Embodiment 1 can be arranged on a substrate with a period of a half wavelength. As indicated in FIG. 6, current is made to flow through a plurality of atomic fine line pn junctions through the bonding pads 11 made of gold, copper, aluminum or other suitable materials from the lead wires 12 similarly made of gold, copper, aluminum or other suitable materials; light emitted by the junction portion will be amplified by means of a resonator constructed by mirrors 13 made of gold, copper aluminum or other suitable materials. Such a laser is so constructed that laser light was taken out from one of the mirrors. The part of the bonding pads and the resonator can be fabricated by using photolithography techniques.

Figure 7:
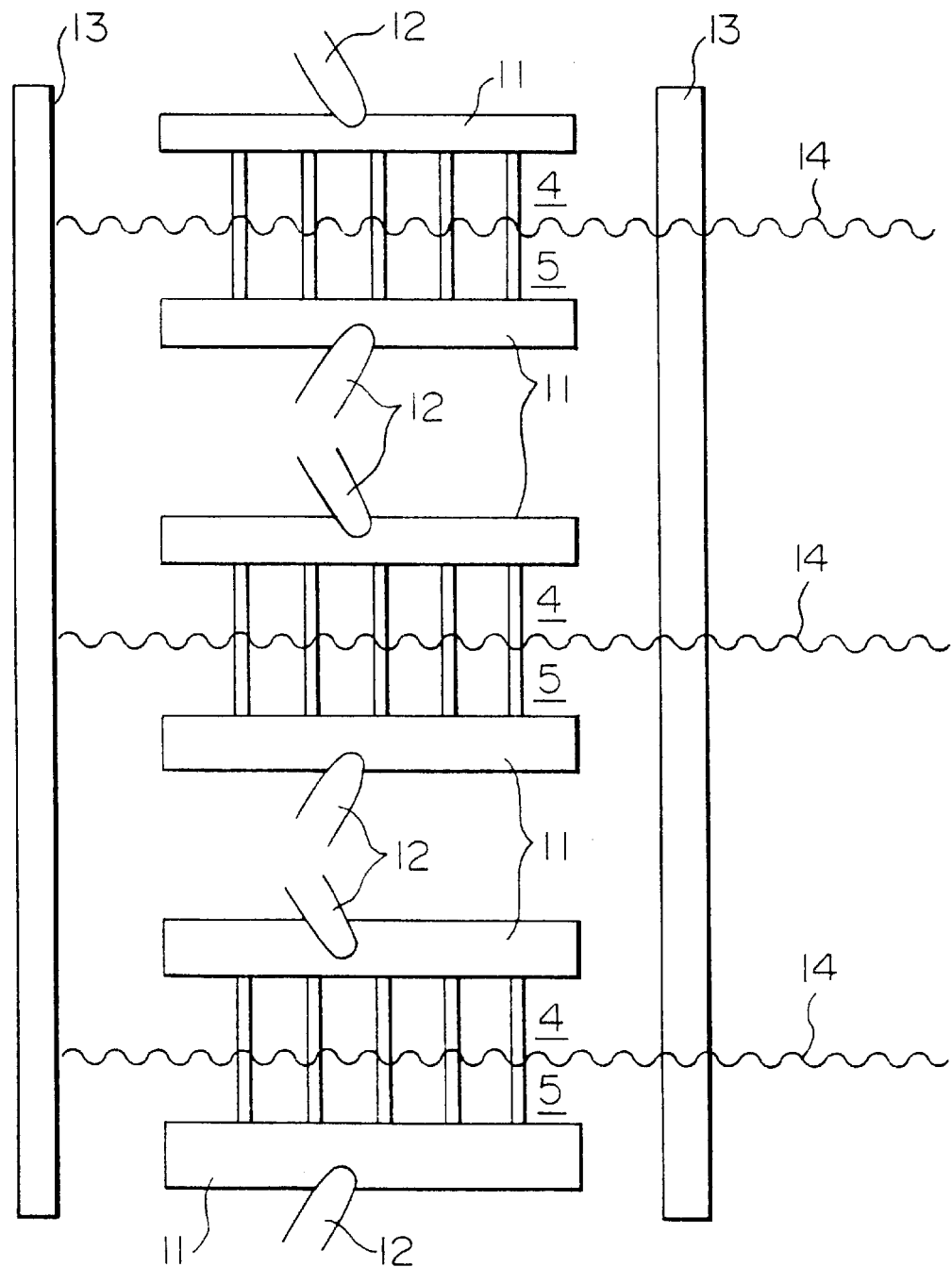
FIG. 7 is a diagram showing a plurality of lasers formed on a same substrate.

If the spectrum of the emitted light is examined the spectrum will have a peak at 2 eV. Light output vs. current characteristics, indicate that laser oscillation takes place. It is possible to vary the wavelength of emitted light by varying the construction of the atomic fine lines so as to vary the band gap, as explained in Embodiment 1. Therefore, lasers having different wavelengths of emitted light can be fabricated so as to be integrated on a same substrate. FIG. 7 shows an aspect of three kinds of lasers having different wavelengths of emitted light fabricated on a same substrate. In this figure, for the sake of simplifying the figure, an atomic fine line is indicated simply by two parallel lines and the p type region and the n type region are indicated by reference numerals 4 and 5, respectively.

Figure 8:
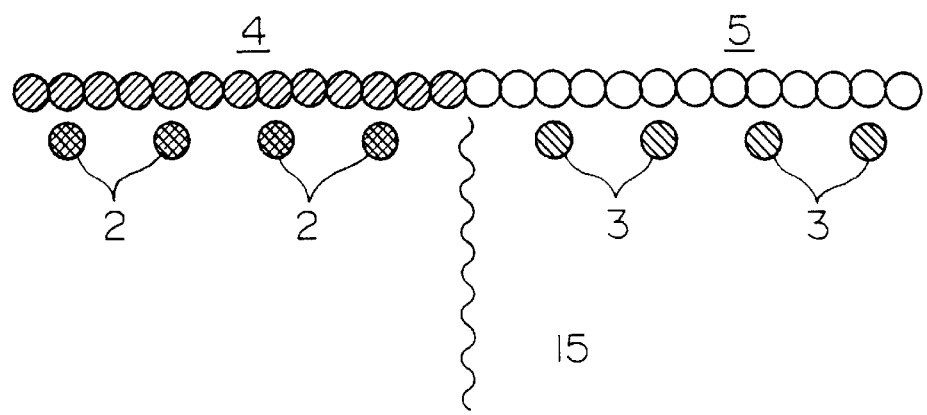
FIG. 8 is a diagram indicating the structure of a photodiode using an atomic fine line pn junction element.

Next a photodiode using an atomic fine line pn junction for light detection will be disclosed. As indicated in FIG. 8, in a DC biased pn junction, light 15 having a wavelength, for which photon energy is greater than the band gap of the atomic fine line, can be detected due to the fact that photons are absorbed, which produces electron-hole pairs.

Figure 9:
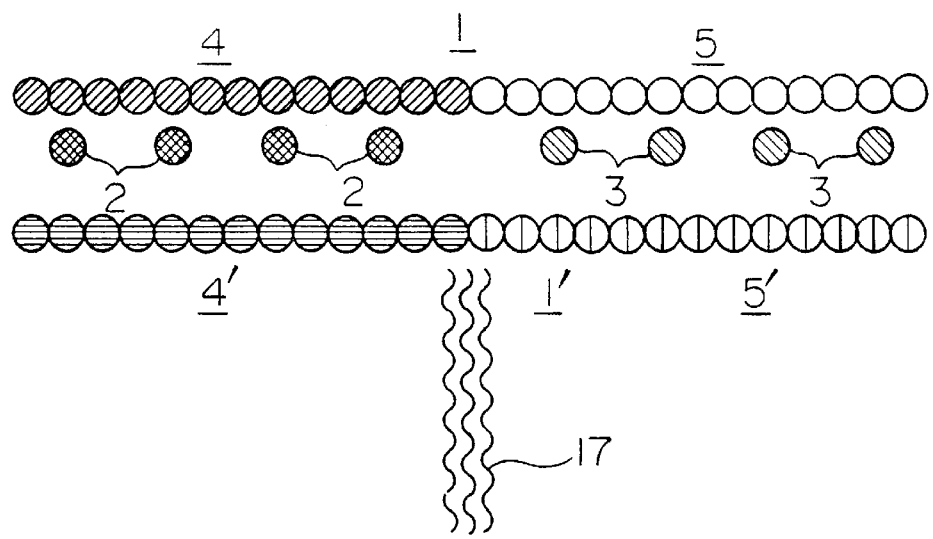
FIG. 9 is a diagram indicating the structure of a photodiode receiving a plurality of wavelengths.

Further, it is possible to receive a plurality of wavelengths of light simultaneously and independently by controlling the band gap by the method explained in Embodiment 1 and arranging atomic fine lines having different band gaps in parallel. FIG. 9 shows the construction of a photodiode using two atomic fine lines as an example. An atomic fine line 1 and another atomic fine line 1' have different band gaps, and the photodiode is so constructed that when it receives two sorts of light 17 having different wavelengths, two sorts of light corresponding to different band gaps of the respective atomic fine lines are detected independently from each other. In order to detect more than three sorts of light, it may be constructed similarly so as to have more than three kinds of atomic fine lines having different band gaps. It can be verified that it can have a satisfactory function as an opto-electronic integrated circuit, when it is constructed by using atomic fine line pn junctions according to the present invention including the laser described above.

Further, it is possible also to fabricate a display element using lasers of the present embodiment. Thus, it is possible to fabricate a display panel by mounting lasers having emitted light wavelengths corresponding to the primary three colors, i.e. red, green and blue. By this method, it is possible to form a display panel having pixels finer by more than 1 order of magnitude than those used in a prior art display panel. Or it was possible also to form a display panel using pixels finer than those used heretofore by working finely filters of three colors of red, green and blue used by a conventional method and irradiating them with laser light according to the present embodiment to make them emit light. By any method it is found that lasers according to the present invention are useful for making pixels finer and reducing the depth of a display-panel by constructing the display panel by arranging a same number of lasers as pixels on the rear side thereof.

Next, the present invention will be explained below in more detail, using some embodiments, in which it is realized in the form of a quantum fine line. As a prerequisite therefor the basic structure of a quantum fine line disclosed in the present invention and an operation thereof will be explained.

Figure 11:
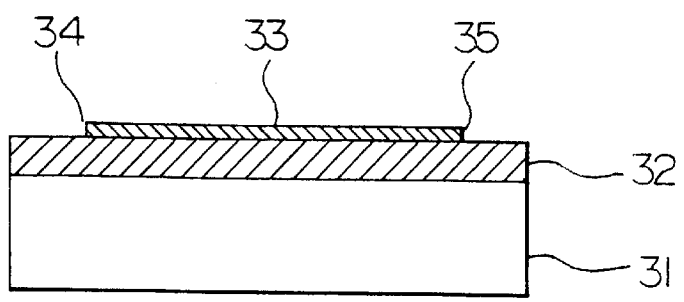
FIG. 11 is a diagram showing the principle of a quantum fine line according to the present invention.

In the basic structure consisting of a quantum fine line 33 disposed on a substrate 31 through an insulating film 32 indicated in FIG. 11, when the two terminals of the quantum fine line 33 are connected with an input 34 and an output 35, a signal inputted through the input 34 propagates along the quantum fine line 33 and is outputted through the output 35. A switching signal can be propagated with a high speed by connecting the quantum fine line with an input from a switching element. Further, it is possible also to propagate the switching signal to succeeding stages with a high speed by connecting the quantum fine line 33 with a switching element and a quantum fine line in a succeeding stage.

(Embodiment 3)

Figure 12A:
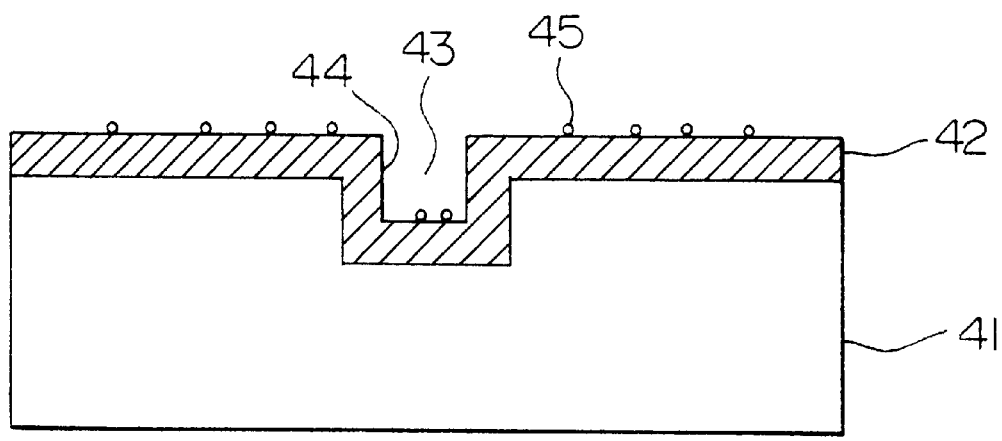
FIGS. 12A and 12B are diagrams showing an embodiment of a method for realizing a high power quantum fine line according to the present invention.
Figure 12B:
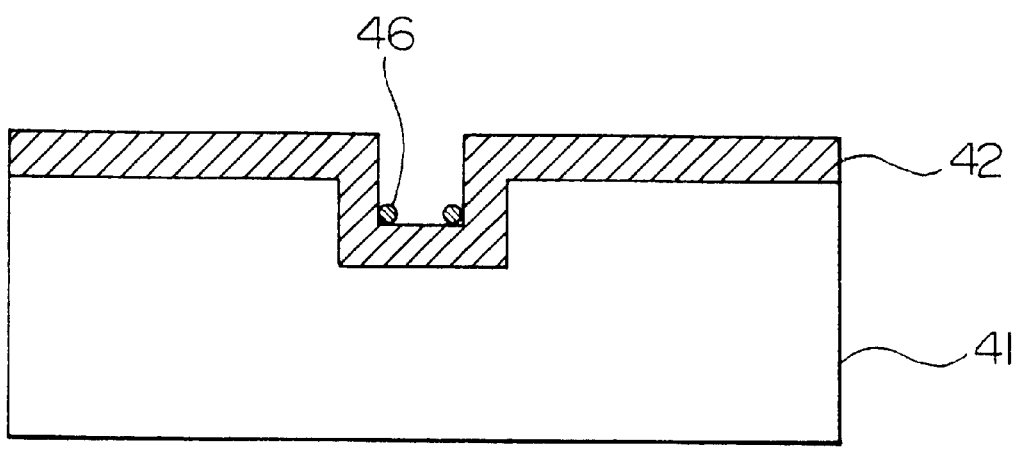

An embodiment of a method for fabricating the quantum fine line disclosed in the present invention will be explained, using FIGS. 12A and 12B. In a fundamental structure consisting of a substrate 41 made of silicon, etc. and an insulating film 42 formed thereon, a groove 43 is formed in the substrate 41 by using fine processing techniques. When the insulating film 42 is grown by the chemical vapor deposition (CVD) method, end portions of the groove 43 become satisfactorily sharp at an atomic level. This is because the amount of atoms supplied to the end portions 44 is small.

In such a structure, metal atoms 45, which are to form wiring on the insulating film 42, are supplied by using the molecular beam deposition (MBD) method, etc. Metal atoms 45 distributed completely at random just after the deposition are gathered at the end portions 44 of the groove 43, as indicated in FIG. 12B by annealing them at a relatively low temperature of about 100 to 500° C. to form quantum fine lines 16 at an atomic level. The reason why atoms move towards the end portions of the groove is explained by supposing that surface energy is small at the end portions of the groove and that atoms can exist there stably.

Consequently, the thickness of the quantum fine line 16 can be controlled with high precision by varying the amount of evaporated metal atoms 45. The metal atoms 45 may be deposited on the insulating film 42 disposed on the substrate 41 while keeping the temperature of the substrate 41 at about 100 to 500° C. This is because migration energy of molecules or atoms on the surface is greater, when they are heated during the deposition; they move more easily on the surface so that they gather more easily to the end portions 44; and therefore the quantum fine line can be formed at a temperature relatively low.

In the present embodiment, a silicon wafer having a surface of (100) and a resistivity of 10 Ω cm is used. After having formed a groove 100 nm deep by electron beam lithography techniques and dry etching techniques, a silicon nitride ($Si_3N_4$) film 10 nm thick is formed by reacting monosilane with ammonium at 600° C. Thereafter, a platinum-palladium alloy is evaporated to 1/100 monolayer by the vacuum evaporation method at a substrate temperature of 300° C.

As the result, it is possible to form a quantum fine line about 6 nm thick at the end portions 44 of the groove. It is possible also to form a similar quantum fine line, using gold in lieu of the platinum-palladium alloy. In this case it is useful to use a substrate temperature as low as about 170° C. during the evaporation.

Further, it can be verified that the quantum fine line can be formed by a similar method also for organic compounds such as polyacetylen, fullerene ($C_{60}$). In this case, it is necessary to add a dopant such as rubidium, potassium, etc. thereto.

Materials constituting the substrate 41, the insulating film 42 and the quantum fine line 16 are not restricted to those cited in the present embodiment, but for example semiconductors such as gallium arsenide, etc., layered compounds of graphite, etc., and so forth may be used as material for the substrate. Further amorphous materials such as silicon oxide, silicon nitride, etc. or crystalline materials such as quartz, etc. may be used as material for the insulating film.

It is a matter of course that metals, semiconductors, etc. may be used as conductive material for the atomic fine line and that a skilled researcher can select a suitable combination thereof.

The quantum fine line obtained in the present embodiment is in a state where atoms are accumulated at random or in a nearly amorphous state.

(Embodiment 4)

In the present embodiment, a method for fabricating quantum fine lines, using a side wall, will be disclosed.

Figure 13A:
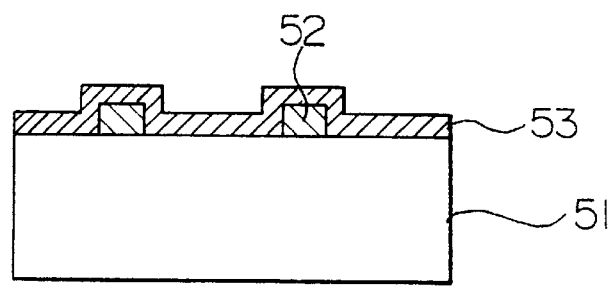
FIGS. 13A and 13B are diagrams showing another embodiment of the method for realizing a high power quantum fine line according to the present invention.
Figure 13B:
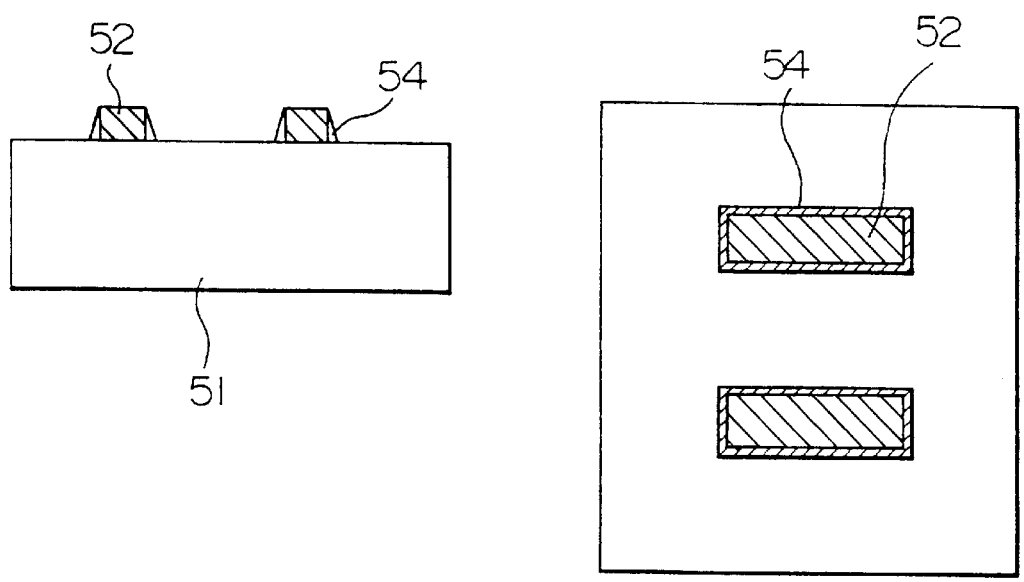

FIG. 13A shows a state where a metal film 53 serving as a conductive body is formed in a conformal shape after having formed protruding portions 52 made of insulator on a substrate 51. FIG. 13B indicates in a side view and in a plan view a state where the metal film 53 is etched by anisotropic etching, leaving quantum fine lines 54 at the ends of the protruding portions 52. The thickness of the quantum fine lines 54 can be controlled by varying etched amount.

For example, in the present embodiment, a silicon wafer of p conductivity type having a surface of (100) and a resistivity of 10 Ωcm, on which an oxide film is grown to a thickness of 1000 nm by the usual thermal oxidation method, is used as a substrate. A silicon nitride film 100 nm thick is formed as the protruding portions 52 and an aluminium film is grown to a thickness of 100 nm as the metal film by the sputtering method. Quantum fine lines 54 having a thickness of 7 nm are obtained by etching the aluminium film at a reaction pressure of 267 Pa while making flow carbon tetrachloride at 10 sccm by means of a parallel plate type reactive ion etching apparatus.

It is a matter of course that the materials and the construction indicated in the present embodiment are only an example of application and all possible examples are not entirely cited and that the subject matter of the present invention consists in the method for fabricating quantum fine lines.

The quantum fine lines obtained in the present embodiment will be in an amorphous or nearly crystalline state.

(Embodiment 5)

In the present embodiment, a method for fabricating quantum fine lines at the bottom portions of V-shaped grooves formed in a substrate by etching will be disclosed.

Figure 14A:
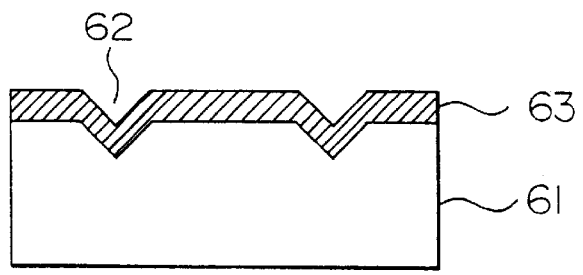
FIGS. 14A and 14B are diagrams showing still another embodiment of the method for realizing a high power quantum fine line according to the present invention.
Figure 14B:
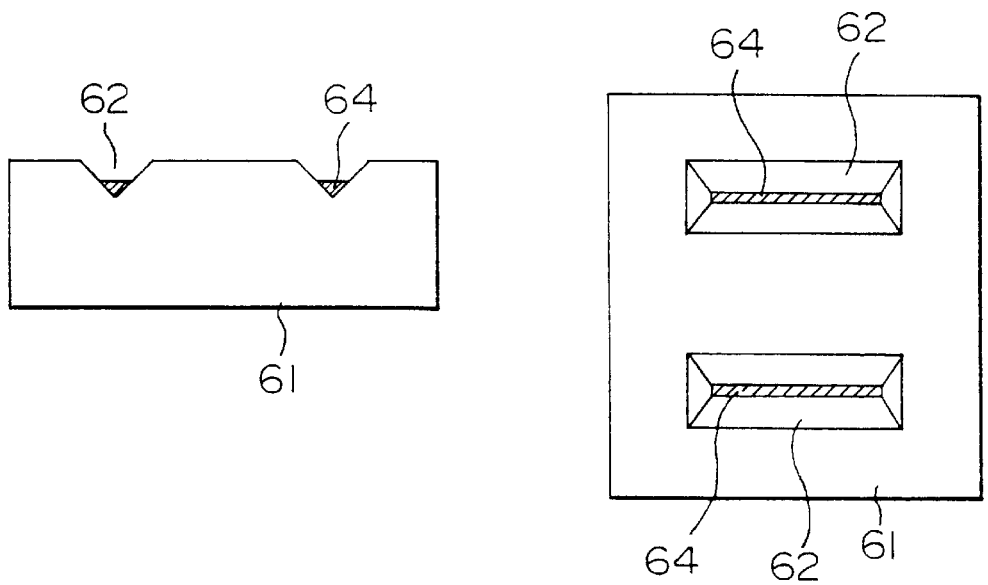

FIG. 14A shows a state where V-shaped grooves 62 are formed in a substrate 61 and a conductive body 63 is deposited thereon. When such a substrate is etched by anisotropic etching, the conductive body 63 is left only at the bottom portions of the V-shaped grooves 62 so as to form the quantum fine lines 64, as indicated by a cross-sectional view and a plan view in FIG. 14B.

In the present embodiment, a silicon wafer of p conductivity type having a surface of (100) and a resistivity of 10 Ωcm, in which V-shaped grooves were formed by lithography techniques and anisotropic etching techniques using an aqueous solution of potassium hydroxide and on which a silicon oxide film is grown to a thickness of 100 nm by the thermal oxidation method as the insulating film, will be used as a substrate. In the case where it cannot be heated to a high temperature of about 1000° C. at the thermal oxidation, e.g. a low temperature deposition method such as the plasma CVD method, etc. may be used.

A tungsten film 33 is deposited to a thickness of 100 nm by the CVD method on the substrate 61 thus prepared and etched by reactive microwave etching using boron tribromide ($BCl_3$). In this way, it is possible to form quantum fine lines 5 nm thick 64 at the bottom portions of the V-shaped grooves 62.

The quantum fine lines obtained in the present embodiment will be in an amorphous or nearly crystalline state.

(Embodiment 6)

In the present embodiment, a method, by which an extremely fine quantum fine line is formed at the periphery of a mask pattern, will be disclosed.

Figure 15:
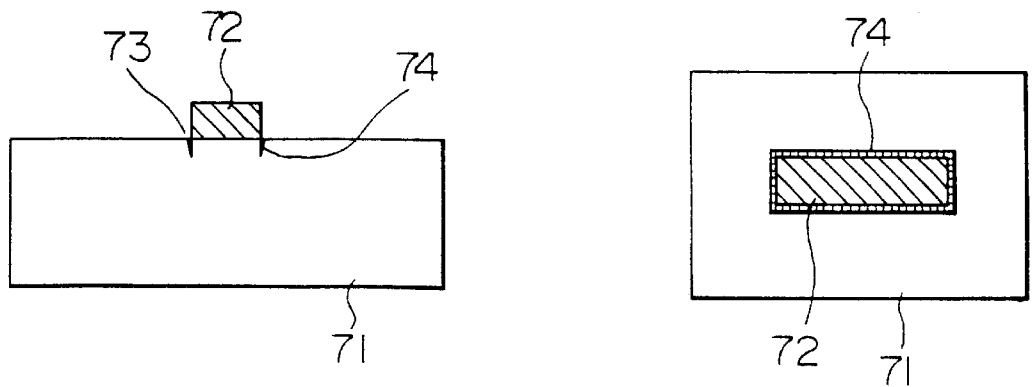
FIG. 15 is a diagram showing still another embodiment of the method for realizing a high power quantum fine line according to the present invention.

Referring to FIG. 15, when an etching mask 72 is formed on a substrate, 71 and further when the substrate 71 is etched by reactive ion etching, only the peripheral portion of the etching mask 72 will be rapidly etched and a trench was formed. It was possible to realize a quantum fine line 74 as indicated in FIG. 15, when a metal thin film is deposited on the substrate thus constructed and the metal thin film is again etched by anisotropic etching using reactive ion etching.

After having an etching mask consisting of a silicon oxide film 200 nm thick on an n conductivity type silicon wafer having a surface of (111) and a resistivity of 10 Ωcm, etching is effected at a gas pressure of 400 Pa by means of a parallel plate type reactive ion etching apparatus using boron tribromide (BBr$_3$) as etching gas to form a trench 400 nm deep having a width of 50 nm at the upper side in the peripheral portion of the etching mask 72.

A trench having a width of 10 nm is obtained by dry-oxidizing a construction thus prepared at 900° C. and by growing an oxide film 20 nm thick. It is possible to realize a quantum fine line 10 nm thick within the trench by depositing an aluminium film 300 nm by the CVD method and by effecting anisotropic etching by reactive ion etching.

The quantum fine line obtained in the present embodiment is in an amorphous or nearly crystalline state.

(Embodiment 7)

In the present embodiment, a method for forming a quantum fine line, utilizing surface characteristics of a silicon oxide film deposited by the CVD method, will be disclosed.

Figure 16A:
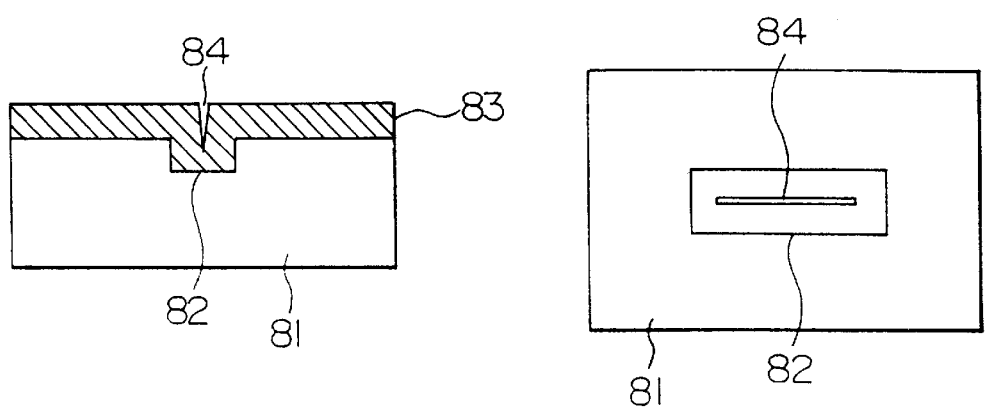
FIGS. 16A and 16B are diagrams showing still another embodiment of the method for realizing a high power quantum fine line according to the present invention.

FIG. 16A indicates a state where after having formed a recess portion 82 in a substrate 81, a silicon oxide film 83 is deposited by the CVD method and it was etched by using a dilute aqueous solution of hydrofluoric acid to form a trench 84.

The reason why such a trench 84 is formed is that the surface of the silicon oxide film deposited by the CVD method is stabilized; the interior of the trench is buried gradually with the silicon oxide film; even if it seems that two surfaces meet finally with each other from the left and the right and the trench is filled completely therewith, chemically these surfaces are not bound completely in reality; and when it is etched by using an aqueous solution of hydrofluoric acid, this interface therebetween is etched rapidly.

Consequently, the width of the trench 84 can be controlled by using a satisfactorily dilute etching solution. Such a phenomenon takes place generally in a deposited layer of an insulating film and is not observed in semiconductor such as polycrystalline silicon. It is thought that this is attributable to a difference in the interatomic binding state.

Figure 16B:
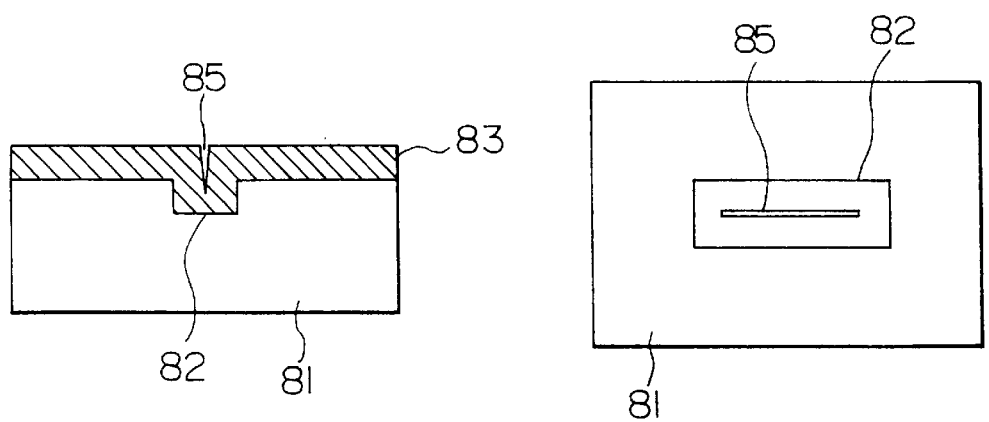

FIG. 16B indicates a state where a silicon layer is deposited by the CVD method on the substrate thus prepared and a quantum fine line 85 is realized by etching it by reactive ion etching. Metals such as tungsten, molybdenum, aluminium, etc. can be used also as material for the quantum fine line 85.

A recess portion 100 nm deep having a width of 100 nm is formed on an n conductivity type wafer having a surface of (111) and a resistivity of 10 Ωcm by lithography and etching techniques and the surface thereof is rinsed and cleaned satisfactorily by using a so-called RCA cleaning solution consisting of an aqueous solution of ammonium and an aqueous solution of hydrofluoric acid. Thereafter, the recess portion is filled with silicon oxide by depositing a silicon oxide film to a thickness of 70 nm by the reduced pressure CVD method.

After having prepared such a structure, it is etched for 10 seconds by using an etching solution obtained by diluting 100 times a 50% aqueous solution of hydrofluoric acid and rinsed with ultra-pure water. By this etching, only the part where two surfaces met with each other was etched rapidly and it was possible to form a trench 30 nm deep having a width of 5 nm at the upper side.

When polycrystalline silicon is deposited to a thickness of 5 nm by the reduced pressure CVD method using monosilane (SiH$_4$) as starting material gas, and, thereafter, it is anisotropically etched by microwave plasma etching, a fine line of polycrystalline silicon 4 nm thick will be formed in the trench.

It is a matter of course that, in the present embodiment, the material of the substrate 81, the material and the thickness of the insulating film 83, the material of the quantum fine line 85, etc. are not restricted to those described therein. Intercalation compounds of graphite, molybdemun disulfide, etc., semiconductors such as gallium arsenide, etc., materials having an electrically insulating effect such as insulators made of quartz, etc., or matters, on which materials having an electrically insulating effect can be formed, can also be used in principle for the substrate 81.

In general, silicon oxide is suitable for the insulating film 83. However, insulating materials such as silicon nitride, aluminium oxide, etc. can be used therefor. The material of the quantum fine line 85 is not restricted specifically to those cited here, but any conductor can be used therefor. A skilled researcher can select a suitable combination thereof.

The quantum fine line obtained in the present embodiment will be in an amorphous or nearly crystalline state.

Characteristics of the quantum fine lines obtained in the 5 embodiments described above will be explained.

Figure 17:
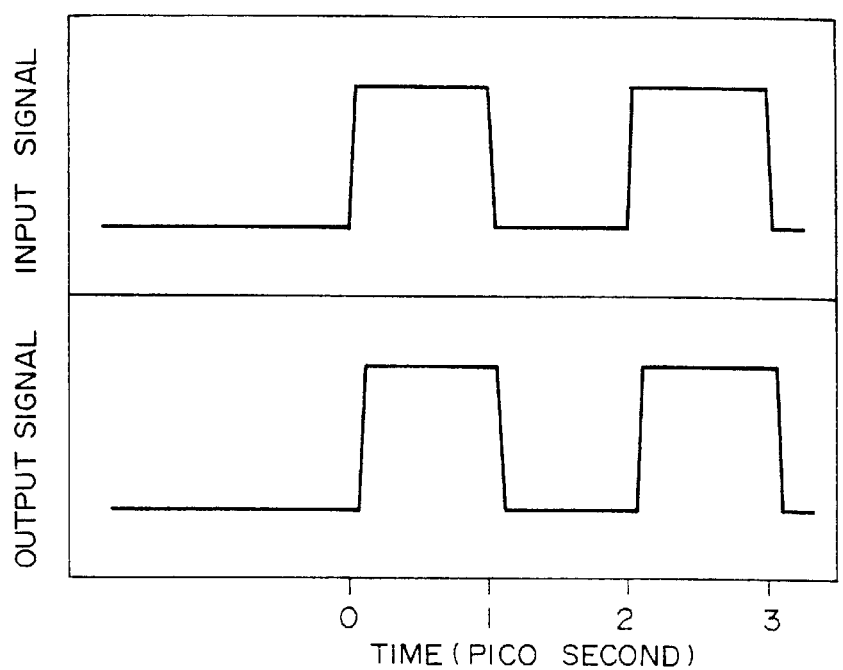
FIG. 17 is a diagram indicating an example of electric conducting characteristics of a quantum fine line according to the present invention.

FIG. 17 indicates signal response of a quantum fine line, i.e. time response characteristics of an output signal to an input signal. As clearly seen from the figure, by using a quantum fine line according to the present invention as a signal line, it is possible to decrease time delay of a signal to a value which is almost negligibly small.

The reason for this is that, in such a small structure, the propagation speed of a signal is not determined simply by a time constant defined by resistance and capacitance of the signal path but the main conducting mechanism thereof is quantum ballistic conduction. Consequently by using a quantum fine line signal transfer with a speed remarkably higher than that obtained by a wiring structure in a conventional electronic circuit can be obtained.

(Embodiment 8)

In the present embodiment, some examples of application of the quantum fine lines disclosed in the above embodiments are shown.

Figure 18A:
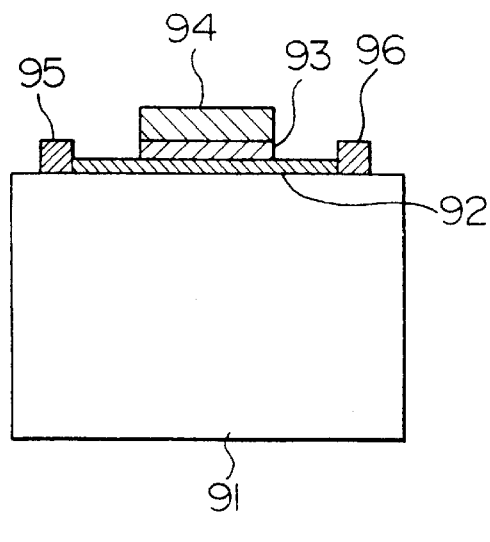
FIGS. 18A and 18B are diagrams indicating an example of application of a quantum fine line according to the present invention.
Figure 18B:
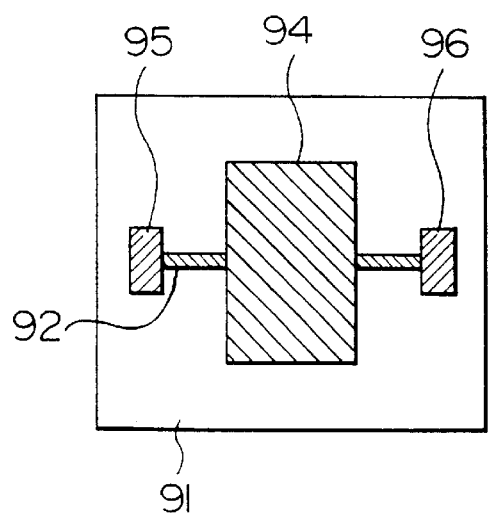

FIGS. 18A and 18B are a cross-sectional view and a plan view, respectively, of a structure consisting of a quantum fine line 92 formed on a substrate 91, an insulating film 93 and a conductor 94. Conductivity of the quantum fine line 92 can be controlled by varying the voltage applied to the conductor 94 through the insulating film 93.

In the present embodiment, in a structure consisting of a quantum fine line made of silicon 5 nm thick, an insulating film 93 made of silicon oxide 10 nm thick, and a conductor 94 made of aluminium 100 nm thick, it is possible to vary the conductivity from an input 95 to an output 96 of the quantum fine line 92 by 8 orders of magnitude by applying a voltage of 1 V to the conductor 94. This means that the quantum fine line disclosed in the present invention can be used as a switching device.

Next, an embodiment in which a stable atomic fine line of high conductivity is obtained by using a combination of specified species of atoms, and another embodiment, in which an atomic fine line whose conductivity type is controlled so as to be of p type or n type is obtained, will be explained.

These embodiments are characterized in that, in order to achieve a device at an atomic level, no analogy is traced with bulk, but attention is paid to the fact that combinations, which are thought to be impossible for bulk from the point of view of the stability thereof, can act usefully, and that this idea is utilized.

Besides the embodiments described above, it is also possible to obtain a fine line of high conductivity, without using such materials consisting of single metal atoms as Al, Ag, Au, etc. used for bulk is not used. It is known that in combinations of species of atoms such as III–V (+3 and −3 in valency), II–VI (+2 and −2 in valency), I–VII (+1 and −1 in valency), etc., although the sum of valencies is 0, e.g. when IV atoms are substituted for a part, e.g. 10 ppm, of III atoms, donors are produced so that the conductivity type can be controlled so as to be of n type. The sum of valencies at this time is +10 ppm. The amount of substitution used usually for bulk semiconductor is a value as extremely small as 0.1 to 100 ppm.

In these embodiments the amount of substituting IV atoms is greater than 0.1%, which is significantly greater than that used for bulk. In an extreme case, not III–V compounds but e.g. IV–V compounds, in which V atoms are substituted for 100% of III atoms, are used. Because of the particularity of the one-dimensional property, proper conductivity type control cannot be effected by extremely small doping as used for bulk.

Conductivity type control to p type can be effected in a similar way. Contrary to the bulk material, e.g. V atoms are substituted for 0.1 to 100% of VI atoms in II–VI compounds and in an extreme case II–V compounds are used therefor.
(Embodiment 9)

Figure 19:
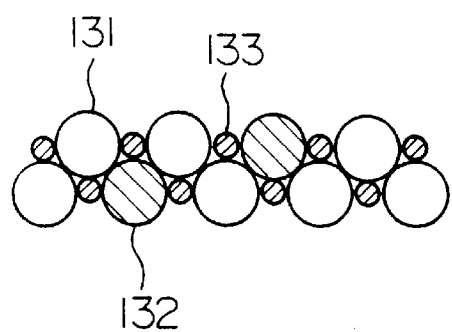
FIG. 19 is a diagram showing the structure of a one-dimensional conductor consisting of Ga, As and Se atoms described in Embodiment 1.

FIG. 19 shows an example, in which Se atoms 132 are substituted for about 10% of As atoms in Ga atoms 133 and As atoms 131 and atoms are manipulated by means of a manipulator like STM. Insulating Si is used for the substrate.

In this example, supposing that the valency of Ga is +3, that of As is −3, and that of Se substituted for about 10% of As is −2, the sum of valencies per unit cell is +0.1. This atomic fine line has an n conductivity type.

Figure 20:
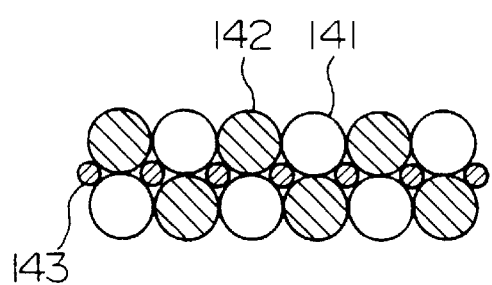
FIG. 20 is a diagram showing the structure of a one-dimensional conductor consisting of Mo, S and P atoms described in Embodiment 1.

Similarly FIG. 20 indicates a fine line basically consisting of $MOS_2$, in which P atoms 142 are substituted for about 50% of S atoms 141. The valency of Mo atoms 143 is +4, that of S atoms is −2, and that of P atoms is −3 so that the atomic fine line has a hole conduction type, for which the sum of valencies per unit cell is −1 in average.
(Embodiment 10)

Figure 21:
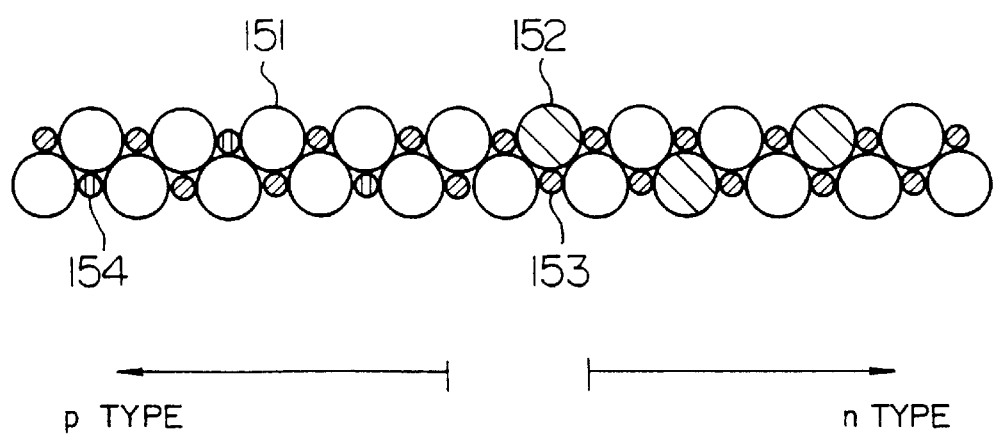
FIG. 21 is a diagram showing the structure of a diode having a one-dimensional conductor whose conductivity type is controlled so as to be of p type and n type described in Embodiment 2.

In order to construct a diode having a pn junction by atomic electronics, at first $Ga_{0.3}Pb_{0.7}Te$ is prepared by substituting Ga atoms 154 for 30% of Pb atoms 153 in PbTe consisting of Pb atoms 153 and Te atoms 151, as indicated in FIG. 21. The sum of valencies of this system is +0.3 and it has an electron conduction type.

On the other hand, $PbAs_{0.3}Te_{0.7}$, for which As atoms 152 are substituted for 30% of Te atoms 151 similarly in PbTe so that it can be connected with that atomic fine line, is formed. A fine line constructed with these two systems has conducting characteristics having a rectifying property similar to a diode in bulk.

That is, current is observed, when a + potential is applied to the PbAsTe side, and on the contrary, no significant current is observed, when a − potential is applied thereto.
(Embodiment 11)

A semi-insulating GaAs wafer is used for the substrate. In a system consisting of mainly Si atoms 161, as indicated in FIG. 22, As atoms 162 are substituted for about 30% of Si atoms 161 so that the system has a function similar to that of the emitter E in a bulk transistor.

Then at least 15 atom layers of a system, in which Ga atoms 164 are substituted for 50% of Si atoms 161, are connected with this E. This intermediate layer has a function similar to the base B in the bulk transistor. The last atom layer is one, in which P atoms 163 are substituted for about 30% of Si atoms 161, having a function similar to that of the collector C in the bulk transistor.

A one-dimensional series of atomic fine lines having three kinds of conducting characteristics thus constructed has a function similar to that of the bulk transistor.
(Embodiment 12)

A semi-insulating GaP wafer is used for the substrate. Two atomic fine lines, in which As atoms 172 are substituted for about 30% of Si atoms 171 in a system consisting of mainly Si atoms 171, as indicated in FIG. 23, are disposed with a distance 173 (at least 3 nm) on an insulating GaAs substrate.

A long fine line as indicated in FIG. 23 has functions similar to those of the source S and the drain D in a bulk electric field effect transistor. There exist no atomic fine lines on this distance of 3 nm. When a certain electric field is applied between S and D, the electric field is applied thereto through the substrate so that it has a function similar to that of the channel in a bulk transistor.

In order to have a part of these S-D fine lines have a function similar to that of the channel in the bulk transistor, in short fine lines, i.e. in parts opposite to the gate G they are so constructed that As atoms are substituted for Si atoms only on the sides closer to the gate G.

The structure consisting of two atomic fine lines having one kind of conductivity type has a function similar to that of the bulk electric field transistor.

Hereinbelow stability in these embodiments 9 to 12 will be briefly explained from a point of view different from that of Embodiments 1 to 8.

In many trials for fabricating prior art atomic fine lines it is usual to trace an analogy with bulk. In order to construct a metal conductor fine line by manipulating it at an atomic level, it is usual to try to arrange single metal atoms e.g. of Al, Ag and Au at a width at most of several atoms by using peripheral techniques of STM.

Further, similarly to electronics in bulk, it was usual to try to construct a diode or a transistor while controlling the conductivity type so as to be of p type or n type by introducing an extremely small amount of impurities of about 1 ppm into semiconductor.

However, for two following reasons, it was difficult to expect to maintain initial characteristics stably in a long time.

The first reason will be described below. It is extremely difficult to construct a stable atomic fine line due to the fact that decrease in total energy due to interatomic metal binding electrons is not great in a one-dimensional arrangement of metal atoms. In addition, fine lines of metal atoms are easily oxidized by atmosphere and often change their state.

Figure 24B:
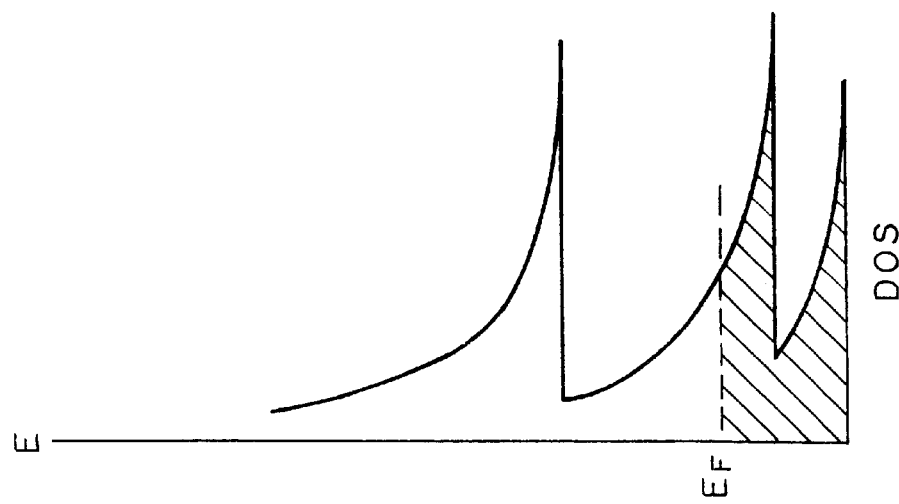
FIGS. 24A and 24B are conceptual diagrams indicating a state of electrons and a density of states (DOS), respectively, in a one-dimensional conductor consisting of single metal atoms.
Figure 24A:
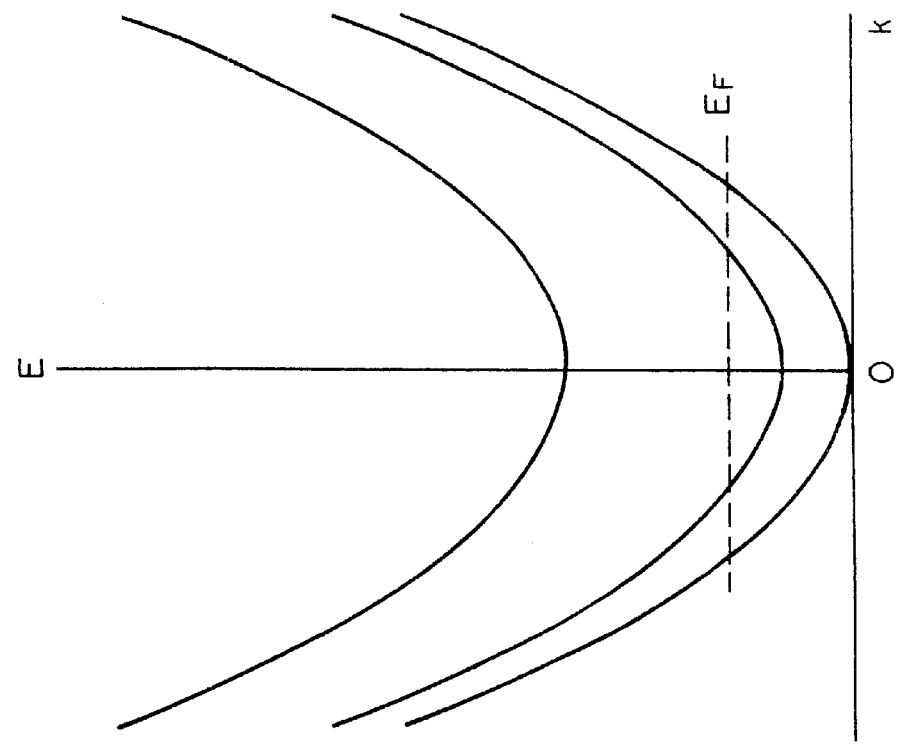

The second reason will be described below. It is well known that it is possible to obtain a density of state (DOS) as indicated in FIG. 24B in a fine line constructed by arranging metal atoms as a result of subjecting it to shape quantization in a two-diemensional plane perpendicular to the fine line, as indicated conceptually in FIGS. 24A and 24B. In FIGS. 24A and 24B, the abscissas represent the wave number and the density of state (DOS), respectively, and the ordinates indicate the energy.

Figure 25B:
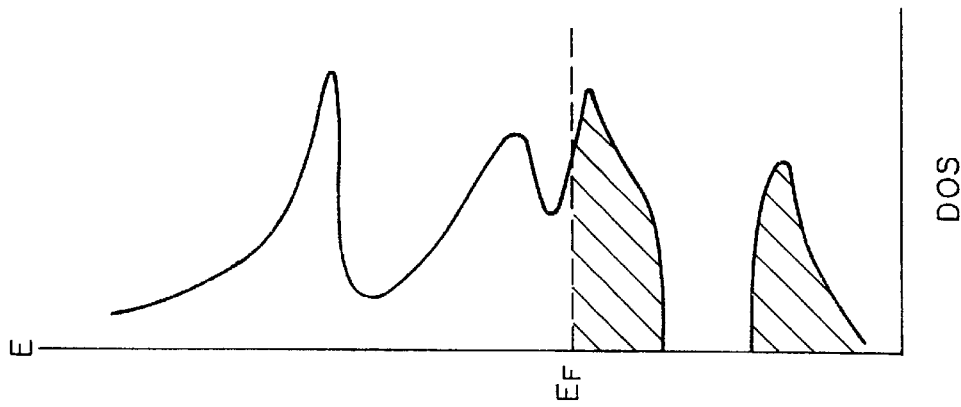
FIGS. 25A and 25B are conceptual diagrams indicating a state of electrons and a density of states (DOS), respectively, in a one-dimensional conductor consisting of a plurality of atoms, on which the present invention is based.
Figure 25A:
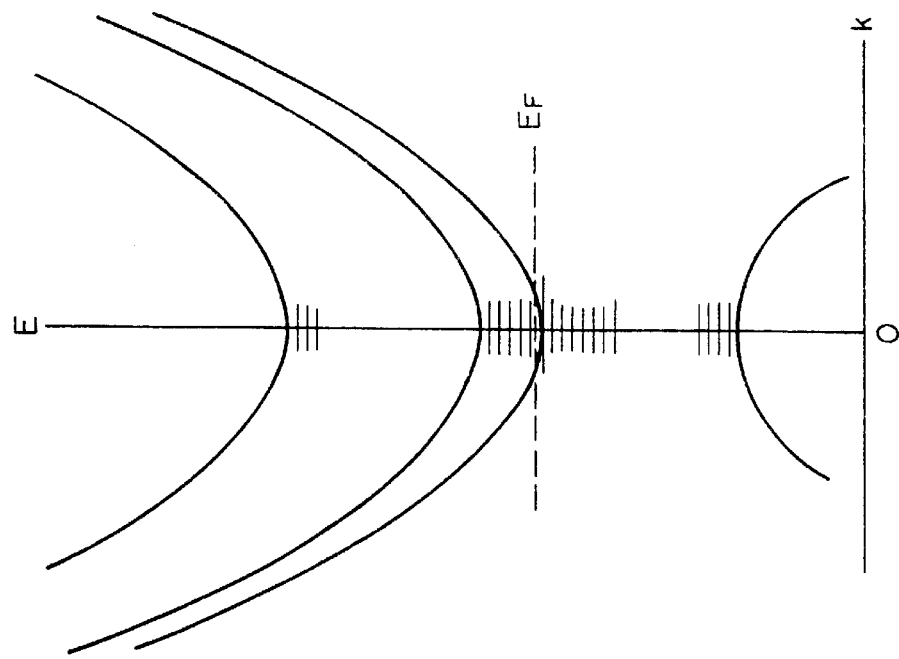

On the other hand, in a fine line consisting of a plurality of species of atoms proposed in Embodiments 9 to 12, it has a DOS different from that obtained in the case of a fine line consisting of metal atoms described previously, as indicated in FIG. 25B, due to the fact that a state as accumulation of a number of dangling bond or impurity levels known in a bulk system, as indicated in FIGS. 25A and 25B, is produced. In FIGS. 25A and 25B, the abscissas represent the wave number and the density of state (DOS), respectively, and the ordinates indicate the energy. In this case, controllability to set the DOS at the Fermi level to a desired value is better than in a fine line consisting of metal atoms and thus it is more useful from the industrial view point.

What is claimed is:

1. An atomic fine line pn junction element comprising:
an atomic fine line arranged on one or a plurality of straight lines, in a ring shape or on a curve; and
respective elements disposed in a proximity of and spaced apart from said atomic fine line for supplying electrons and holes thereto.

2. An atomic fine line pn junction element according to claim 1, wherein the respective elements for supplying electrons and holes to said atomic fine line are constructed by atoms having a high power of supplying electrons and atoms having a high power of attracting electrons.

3. An atomic fine line pn junction element according to claim 2, wherein an amount of electrons and holes supplied to said atomic fine line is regulated by varying distance between the atoms supplying them and said atomic fine line or a number of said atoms.

4. An atomic electronic device including conductor fine lines, wherein each of said conductor fine lines is comprised of a plurality of unit cells, comprising at least two species of atoms, said unit cells being joined together to form said fine lines, wherein each of said conductor fine lines has a width corresponding to at least several atoms arranged in a transversal direction; and the at least two species of atoms are selected so that a sum $\Sigma i$ of valencies i of atoms in a unit cell is not 0.

5. An atomic electronic device according to claim 4, wherein a conductor fine line is constructed so as to have a hole conduction type by choosing atoms constituting it so that the sum $\Sigma i$ of valencies i of atoms per unit cell is comprised between $-1$ and $-0.1\%$ in average.

6. An atomic electronic device according to claim 4, wherein a conductor fine line is constructed so as to have an electron conduction type by choosing atoms constituting it so that the sum $\Sigma i$ of valencies i of atoms per unit cell is comprised between $+1$ and $+0.1\%$ in average.

7. An atomic electronic device according to claim 4, wherein a conductor fine line is constructed so as to have a rectifying property similar to that of a bulk diode by having a part of said conductor fine line have an electron conduction type and another part adjacent thereto have a hole conduction type.

8. An atomic electronic device according to claim 5, wherein a conductor fine line is constructed so as to have a rectifying property similar to that of a bulk diode by having a part of said conductor fine line have an electron conduction type and another part adjacent thereto have a hole conduction type.

9. An atomic electronic device according to claim 6, wherein a conductor fine line is constructed so as to have a rectifying property similar to that of a bulk diode by having a part of said conductor fine line have an electron conduction type and another part adjacent thereto have a hole conduction type.

10. An atomic electronic device according to claim 4, wherein a conductor fine line is constructed so as to have an amplifying property similar to that of a bulk npn transistor (or pnp transistor) by having two parts distant from each other of said conductor fine line have an electron conduction type (or hole conduction type) and a part between them have a hole conduction type (or electron conduction type).

11. An atomic electronic device according to claim 5, wherein a conductor fine line is constructed so as to have an amplifying property similar to that of a bulk npn transistor (or pnp transistor) by having two parts distant from each other of said conductor fine line have an electron conduction type (or hole conduction type) and a part between them have a hole conduction type (or electron conduction type).

12. An atomic electronic device according to claim 6, wherein a conductor fine line is constructed so as to have an amplifying property similar to that of a bulk npn transistor (or pnp transistor) by having two parts distant from each other of said conductor fine line have an electron conduction type (or hole conduction type) and a part between them have a hole conduction type (or electron conduction type).

13. An atomic electronic device according to claim 4, wherein a pair of conductor fine lines consisting of a conductor fine line of one conductivity type and another conductor fine line disposed on an insulating body or a substrate with a gap, where there is no conductor, are constructed so as to have an amplifying property similar to that of a bulk field effect type transistor.

14. An atomic electronic device according to claim 5, wherein a pair of conductor fine lines consisting of a conductor fine line of one conductivity type and another conductor fine line disposed on an insulating body or a substrate with a gap, where there is no conductor, are constructed so as to have an amplifying property similar to that of a bulk field effect type transistor.

15. An atomic electronic device according to claim 6, wherein a pair of conductor fine lines consisting of a conductor fine line of one conductivity type and another conductor fine line disposed on an insulating body or a substrate with a gap, where there is no conductor, are constructed so as to have an amplifying property similar to that of a bulk field effect type transistor.

16. An atomic electronic device according to claim 1, wherein the atomic fine line is constructed so as to have a hole conduction type by choosing atoms constituting it so that the sum $\Sigma i$ of valencies i of atoms per unit cell is comprised between $-1$ and $-0.1\%$ in average.

17. An atomic electronic device according to claim 1, wherein the atomic fine line is constructed so as to have an electron conduction type by choosing atoms constituting it so that the sum $\Sigma i$ of valencies i of atoms per unit cell is comprised between $+1$ and $+0.1\%$ in average.

18. An atomic electronic device according to claim 1, wherein the atomic fine line is constructed so as to have a rectifying property similar to that of a bulk diode by having a part of said atomic fine line have an electronic conduction type and another part adjacent thereto have a hole conduction type.

19. An atomic electronic device according to claim 16, wherein the atomic fine line is constructed so as to have a rectifying property similar to that of a bulk diode by having a part of said atomic fine line have an electronic conduction type and another part adjacent thereto have a hole conduction type.

20. An atomic electronic device according to claim 17, wherein the atomic fine line is constructed so as to have a rectifying property similar to that of a bulk diode by having a part of said atomic fine line have an electronic conduction type and another part adjacent thereto have a hole conduction type.

21. An atomic electronic device according to claim 1, wherein the atomic fine line is constructed so as to have an amplifying property similar to that of a bulk npn transistor (or pnp transistor) by having two parts distant from each other of said atomic fine line have an electron conduction type (or hole conduction type) and a part between them have a hole conduction type (or electron conduction type).

22. An atomic electronic device according to claim 16, wherein the atomic fine line is constructed so as to have an amplifying property similar to that of a bulk npn transistor (or pnp transistor) by having two parts distant from each other of said atomic fine line have an electron conduction type (or hole conduction type) and a part between them have a hole conduction type (or electron conduction type).

23. An atomic electronic device according to claim 17, wherein the atomic fine line is constructed so as to have an amplifying property similar to that of a bulk npn transistor (or pnp transistor) by having two parts distant from each other of said atomic fine line have an electron conduction type (or hole conduction type) and a part between them have a hole conduction type (or electron conduction type).

24. An atomic electronic device according to claim 1, wherein a pair of atomic fine lines are provided consisting of an atomic fine line of one conductivity type and another atomic fine line disposed on an insulating body or a substrate with a gap, where there is no conductor, said pair of atomic fine lines being constructed so as to have an amplifying property similar to that of a bulk field effect type transistor.

25. An atomic electronic device according to claim 16, wherein a pair of atomic fine lines are provided consisting of an atomic fine line of one conductivity type and another atomic fine line disposed on an insulating body or a substrate with a gap, where there is no conductor, said pair of atomic fine lines being constructed so as to have an amplifying property similar to that of a bulk field effect type transistor.

26. An atomic electronic device according to claim 17, wherein a pair of atomic fine lines are provided consisting of an atomic fine line of one conductivity type and another atomic fine line disposed on an insulating body or a substrate with a gap, where there is no conductor, said pair of atomic fine lines being constructed so as to have an amplifying property similar to that of a bulk field effect type transistor.

27. An atomic fine line pn junction element comprising:

an atomic fine line arranged on one or a plurality of straight lines, in a ring shape or on a curve; and respective elements disposed in a proximity of and spaced apart from said atomic fine line for supplying electrons and holes thereto;

wherein said atomic fine line is disposed on an insulating substrate.

28. An atomic electronic device including conductor fine lines, wherein each of said conductor fine lines is comprised of a plurality of unit cells, comprising at least two species of atoms, said unit cells being joined together to form said fine lines, wherein each of said conductor fine lines has a width corresponding to at least several atoms arranged in a transversal direction; and the at least two species of atoms are selected so that a sum Σi of valencies i of atoms in a unit cell is not 0, wherein the conductor fine lines are disposed on an insulating substrate.

29. An atomic electronic device according to claim 4, wherein material forming the conductor fine lines comprises at least one combination of species of atoms selected from the following groups: III–V; II–VI; I–VII; III–V; IV–V; and II–V.

30. An atomic electronic device according to claim 4, wherein material forming the conductor fine lines comprises at least one combination of species of atoms selected from the groups of: III–V; II–VI; and I–VII, and at least one additional species of atoms selected from the groups: I–VII.

31. An atomic fine line pn junction element according to claim 1, wherein the atomic fine line is comprised of silicon atoms formed on a silicon dioxide substrate.

32. An atomic fine line pn junction element according to claim 31, wherein the elements are sodium atoms and chlorine atoms.

33. An atomic fine line pn junction element according to claim 27, wherein the atomic fine line is comprised of silicon atoms and wherein the insulating substrate is comprised of silicon dioxide.

34. An atomic fine line pn junction element according to claim 33, wherein the elements are sodium atoms and chlorine atoms.

35. An atomic fine line pn junction element according to claim 1, wherein the atomic fine line consists essentially of metal atoms.

36. An atomic fine line pn junction element according to claim 27, wherein the atomic fine line consists essentially of metal atoms.

37. An atomic fine line pn junction according to claim 1, wherein said respective elements disposed in proximity of the atomic fine line structure include at least a group IIIA element.

38. An atomic fine line pn junction according to claim 27, wherein said respective elements disposed in proximity of the atomic fine line structure include at least a group IIIA element.

39. An atomic fine line pn junction element comprising:

an atomic fine line arranged in one or a plurality of straight lines, in a ring shape or on a curve, wherein the atomic fine line consists essentially of metal atoms;

a plurality of first doping atoms spaced apart from a first portion of the atomic fine line by a distance sufficiently close to supply electrons to said first portion of the atomic fine line; and a plurality of second doping atoms spaced apart from a second portion of the atomic fine line by a distance sufficiently close to supply holes to said second portion of said atomic fine line, wherein said atomic fine line and said plurality of first and second doping atoms are formed on an insulating substrate.

40. An atomic fine line pn junction element according to claim 39, wherein said first doping atoms include at least group IIIA atoms.

* * * * *